United States Patent
Koo et al.

(10) Patent No.: US 8,378,744 B2
(45) Date of Patent: Feb. 19, 2013

(54) MULTI-MODE POWER AMPLIFIER

(75) Inventors: Bon Hoon Koo, Daejeon (KR); Byeong Hak Jo, Gyunggi-do (KR); Ki Yong Son, Daejeon (KR); Yoo Sam Na, Seoul (KR); Song Cheol Hong, Daejeon (KR)

(73) Assignees: Samsung Electronics Co., Ltd., Gyunggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/279,953

(22) Filed: Oct. 24, 2011

(65) Prior Publication Data
US 2012/0299657 A1 Nov. 29, 2012

(30) Foreign Application Priority Data
May 26, 2011 (KR) .................. 10-2011-0049888

(51) Int. Cl.
*H03F 1/14* (2006.01)
(52) U.S. Cl. .................. 330/51; 330/254; 330/195
(58) Field of Classification Search .................. 330/51, 330/254, 195
See application file for complete search history.

(56) References Cited

U.S. PATENT DOCUMENTS

| | | | | | |
|---|---|---|---|---|---|
| 3,892,983 | A | * | 7/1975 | Okada et al. | 327/487 |
| 5,847,600 | A | * | 12/1998 | Brooks et al. | 330/9 |
| 6,144,254 | A | * | 11/2000 | Irvine et al. | 330/51 |
| 7,420,425 | B2 | * | 9/2008 | Tsai | 330/311 |
| 8,130,033 | B2 | * | 3/2012 | Wolf | 330/51 |
| 2005/0068099 | A1 | * | 3/2005 | Floyd | 330/51 |

FOREIGN PATENT DOCUMENTS

| KR | 10-2004-0062711 A | 7/2004 |
|---|---|---|
| KR | 10-2006-0097240 A | 9/2006 |

* cited by examiner

*Primary Examiner* — Patricia Nguyen
(74) *Attorney, Agent, or Firm* — McDermott Will & Emery LLP

(57) ABSTRACT

There is provided a multi-mode power amplifier operable in a low power mode having a preset power range and in a high power mode having a power range higher than the power range of the low power mode. The multi-mode power amplifier includes: a high power amplifying unit including at least one cascode amplifier to amplify an input signal to a high power level having a preset power range; a low power amplifying unit sharing a common source node of the at least one cascode amplifier to amplify the input signal to a low power level having a power range lower than the high power level; and a coupling unit coupling a transfer path of a signal output from the high power amplifying unit and a transfer path of a signal output from the low power amplifying unit to each other.

10 Claims, 3 Drawing Sheets

MULTI-MODE POWER AMPLIFIER

CROSS-REFERENCE TO RELATED APPLICATIONS

This application claims the priority of Korean Patent Application No. 10-2011-0049888 filed on May 26, 2011, in the Korean Intellectual Property Office, the disclosure of which is incorporated herein by reference.

BACKGROUND OF THE INVENTION

1. Field of the Invention

The present invention relates to a multi-mode power amplifier operable in a low power mode having a preset power range, and, in a high power mode having a power range higher than that of the low power mode.

2. Description of the Related Art

Recently, blocks configuring a wireless transceiver have been implemented using a complementary metal oxide semiconductor (CMOS) process technology and have been integrated in a single chip. However, among these blocks of the wireless transceiver, only a power amplifier has been implemented using an indium gallium phosphide (InGaP)/gallium arsenide (GaAs) heterojunction bipolar transistor (HBT) process. However, the above-mentioned InGAP/GaAs HBT process incurs manufacturing costs higher than those of the CMOS process, needs to be implemented in a multi-chip structure, and there may be difficulty in coupling a block formed thereby with an adjusting circuit block implemented by the CMOS process in order to improve linearity. Due to the above-mentioned reasons, research into a CMOS based power amplifier has been actively undertaken.

Meanwhile, among configuring a wireless communications terminal, components associated with power amplification consume the greatest amount of power. Therefore, power amplifier power efficiency needs to be increased in order to improve the entire call time. Since the wireless communications terminal has an output power controlled according to a distance to a repeater, with reference to a probability density function according to an output power of the wireless communications terminal, an efficiency improvement in a low output power backed off from the maximum power output by 10 dB or more has a direct influence on an improvement in call time. That is, there is a need to increase power efficiency not only in a high power mode having the maximum power output level, but also in a low power mode having a power level lower than the maximum power output level.

Therefore, the necessity for a multi-mode power amplifier performing different power amplification operations in a low power mode and a high power mode has been increased.

In the multi-mode power amplifier according to the related art, in the case in which different signal transfer paths are formed for each of the power modes, an impedance matching circuit is required for each of the signal transfer paths, such that a circuit area increases and manufacturing costs rise. Particularly, in the CMOS process, power loss is generated by a passive device for implementing the impedance matching circuit, such that power efficiency is reduced. In addition, even in a case in which an amplifier circuit is formed for each of the power modes, input and output impedance matching circuits are required, such that a circuit area increases and manufacturing costs rise. In addition, power loss may be generated by a passive device, such that power efficiency is reduced.

SUMMARY OF THE INVENTION

An aspect of the present invention provides a multi-mode power amplifier in which a common source node of a cascode amplifier is used in common and an output is selectively connected to a secondary winding of a coupling unit, such that a separate impedance circuit is not required.

According to an aspect of the present invention, there is provided a multi-mode power amplifier including: a high power amplifying unit including at least one cascode amplifier to amplify an input signal to a high power level having a preset power range; a low power amplifying unit sharing a common source node of the at least one cascode amplifier to amplify the input signal to a low power level having a power range lower than the high power level; and a coupling unit coupling a transfer path of a signal output from the high power amplifying unit and a transfer path of a signal output from the low power amplifying unit to each other.

The low power amplifying unit may include: an amplifying part including an amplifier amplifying the input signal from the shared common source node to the low power level; and a switching part including at least one switch opening or closing the transfer path of the signal through which the signal amplified from the amplifying part is transferred to the coupling unit according to a selection of power modes.

The coupling unit may include a primary winding receiving the signal amplified from the high power amplifying unit and a secondary winding receiving the signal amplified from the low power amplifying unit and electromagnetically coupled to the primary winding to thereby couple the transfer paths of the signals to each other.

The switching part may include a first switch connected between one end of the secondary winding and a ground to thereby transfer the signal amplified from the amplifying part to the secondary winding or connect one end of the secondary winding and the ground to each other.

The switching part further may include: a capacitor connected to the other end of the secondary winding from which the signal is output; and a second switch connected between the capacitor and the ground and being switched on or off together with the first switch, thereby connecting or opening between the capacitor and the ground.

The amplifying part may be an N type metal oxide semiconductor field effect transistor (MOSFET) having a drain outputting the amplified signal, a source connected to the common source node, and a gate receiving a gate signal.

The high power amplifying unit may include: a driving amplifying part including first and second cascode amplifiers connected with each other in parallel to thereby amplify the input signal according to a set gain; and a power amplifying part including third and fourth cascode amplifiers connected with each other in parallel to thereby amplify the signal amplified from the driving amplifying part according to a set gain.

The low power amplifying unit may share a common source node of the first or second cascode amplifier of the driving amplifying part.

The input signal may be a single signal or a balanced signal.

The high power amplifying unit may further include an impedance matching part matching an impedance of a transfer path of the signal between driving amplifying part and the power amplifying part.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

Figure 1:
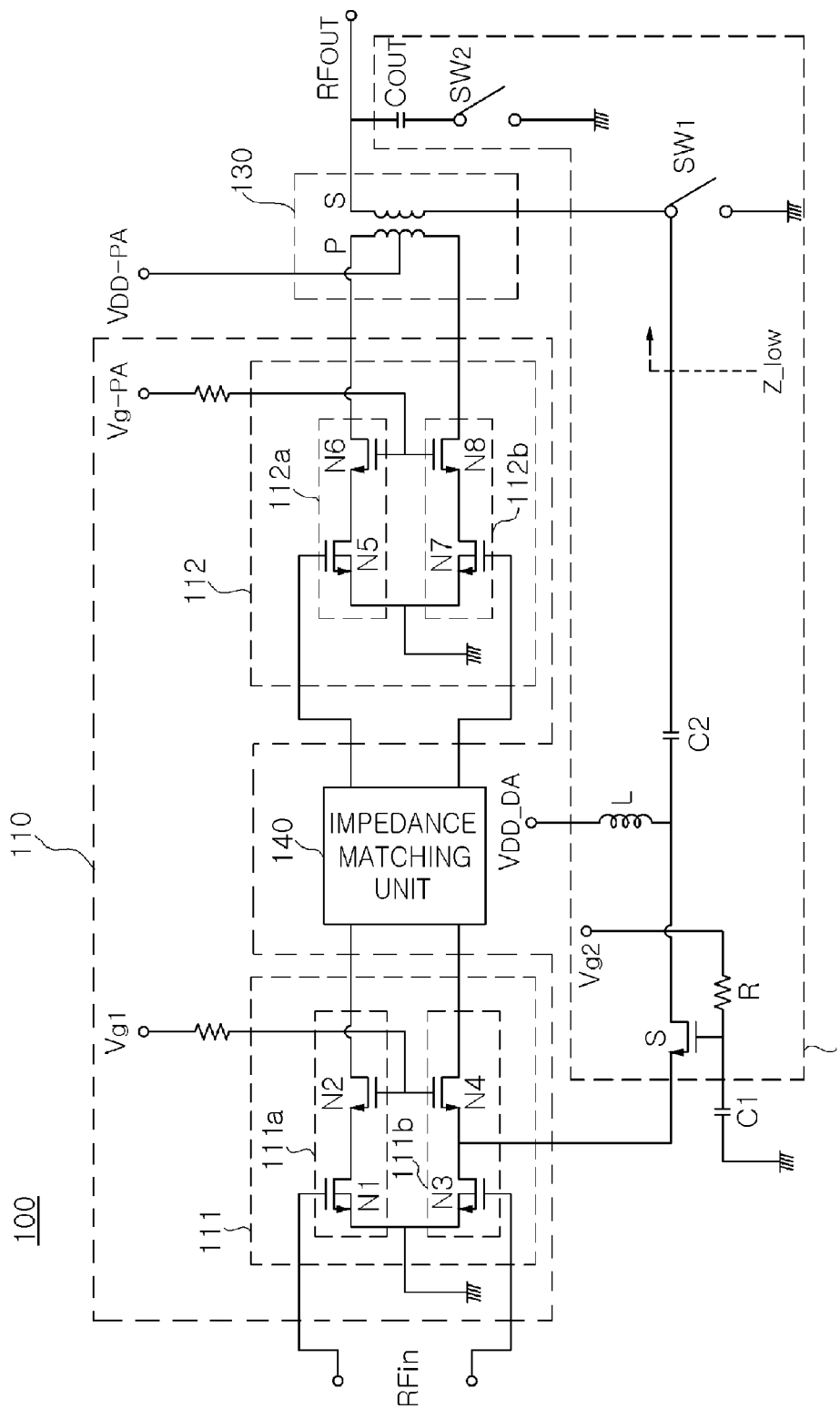
FIG. 1 is a schematic view showing the configuration of a multi-mode power amplifier according to an embodiment of the present invention.

FIG. 1 is a schematic view showing the configuration of a multi-mode power amplifier according to an embodiment of the present invention.

Referring to FIG. 1, a multi-mode power amplifier 100 according to an embodiment of the present invention may include a high power amplifying unit 110, a low power amplifying unit 120, and a coupling unit 130. In addition, the above-mentioned multi-mode power amplifier 100 may be formed by a complementary metal oxide semiconductor (CMOS) process.

The high power amplifying unit 110 may be operated at the time of a high power mode in which an input signal is amplified to a high power level having a preset power level range, or the low power amplifying unit 120 may be operated at the time of a low power mode in which an input signal is amplified to a low power level having a power level range lower than the high power level, according to a selection of a user. The coupling unit 130 may couple signal transfer paths from the high power amplifying unit 110 and the low power amplifying unit 120 to each other.

More specifically, the high power amplifying unit 110 may include a driving amplifying part 111 primarily amplifying an input signal and a power amplifying part 112 reamplifying the amplified signal. For example, the driving amplifying part 111 may amplify a power level of the input signal to 15 dBm, and the power amplifying part 112 may amplify a power level of the signal amplified by the driving amplifying part 111 to 30 dBm.

The driving amplifying part 111 may include at least one cascode amplifier according to types of the input signal. That is, when the input signal is a single signal, the driving amplifying part 111 may include a single cascode amplifier, and when the input signal is a balanced signal, the driving amplifying part 111 may include two cascode amplifiers. For reference, when the input signal is the balanced signal, a balun converting a single signal into a balanced signal may be used in a front end of the driving amplifying part 111. FIG. 1 shows a case in which the balanced signal is input by way of example; however, the present invention is not limited thereto. The driving amplifying part 111 may include a first cascode amplifier 111a and a second cascode amplifier 111b connected in parallel with the first cascode amplifier 111a.

The first cascode amplifier 111a may include first and second metal oxide semiconductor field effect transistors (hereinafter, referred to as MOSFETs) N1 and N2 cascode-connected to each other. Likewise, the second cascode amplifier 111b may include third and fourth MOSFETs N3 and N4 cascode-connected to each other.

The first and second MOSFETs N1 and N2 may be common source connected to each other, and the third and fourth MOSFETs N3 and N4 may be common source connected to each other. Gates of the second and fourth MOSFETs N2 and N4 may be connected to each other as a common gate and have a gate signal Vg1 input thereto. A common source node of the first and second MOSFETs N1 and N2 and a common source node of the third and fourth MOSFETs N3 and N4 may be shared with the low power amplifying unit 120. FIG. 1 shows a case in which the common source node of the third and fourth MOSFETs N3 and N4 is shared with the low power amplifying unit 120; however, the present invention is not limited thereto.

The power amplifying part 112 may include a single cascode amplifier in the case in which the driving amplifying part 111 receives and amplifies a single signal, and include at least two cascode amplifiers in the case in which the driving amplifying part 111 receives and amplifies a balanced signal. As shown in FIG. 1, the power amplifying part 112 may include third and fourth cascode amplifiers 112a and 112b cascode-connected to each other in parallel in the case in which the balanced signal is input to the driving amplifying part 111 by way of example. However, the present invention is not limited thereto.

The third cascode amplifier 112a may include fifth and sixth MOSFETs N5 and N6 cascode-connected to each other, and the fourth cascode amplifier 112b may include seventh and eighth MOSFETs N7 and N8 cascode-connected to each other. Gates of the sixth and eighth MOSFETs N6 and N8 may be connected to each other as a common gate and have a gate signal Vg_PA input thereto.

A signal amplifying operation of the first and second cascode amplifiers 111a and 111b of the driving amplifying part 111 and the third and fourth cascode amplifiers 112a and 112b of the power amplifying part 112 is known in the art. Therefore, a detailed description thereof will be omitted.

The low power amplifying unit 120 or the high power amplifying unit 110 is selectively operated according to a selection of the user. That is, when the user is to amplify the input signal to a high power level having a preset power level range, he/she operates the high power amplifying unit 110 and does not operate the low power amplifying unit 120. On the other hand, when the user is to amplify the input signal to a low power level having a power level range lower than the high power level, he/she operates the low power amplifying unit 120 and does not operate the high power amplifying unit 110.

The low power amplifying unit 120 may share the common source node of one of the first and second cascode amplifiers 111a and 111b of the driving amplifying part 111 of the high power amplifying unit 110 to thereby receive the input signal. FIG. 1 shows a case in which the low power amplifying unit 120 is connected to the common source node of the second cascode amplifier 111b to thereby receive the input signal; however, the present invention is not limited thereto.

The low power amplifying unit 120 may include an amplifying part 121 amplifying the input signal and a switching part 122 opening or closing a signal transfer path according to a selection of the user.

The amplifying part 121 may include at least one amplifier Q amplifying the input signal from the shared common source node, and include an inductor L, a resistor R, and first and second capacitors C1 and C2 as a peripheral circuit of the amplifier Q.

The amplifier Q may be formed of an N type MOSFET having a source connected to the shared common source node, a drain connected to the switching part 122 through the second capacitor C2, and a gate connected to a ground through the first capacitor C1. In addition, the gate may include a gate signal Vg2 input thereto through the resistor R.

The switching part 122 may include a first switch SW1 connected between one end of a secondary winding S of the coupling unit 130 and a ground, and include a capacitor COUT and a second switch SW2 connected to each other in series between the other end of the secondary winding S and a ground.

The first and second switches SW1 and SW2 may switch on or switch off between one end of the secondary winding S of the coupling unit 130 and the ground or between the capacitor COUT connected in series with the other end of the secondary winding S and the ground, according to a power mode selection of the user.

The coupling unit 130 may have a primary winding P and the secondary winding S. One end and the other end of the primary winding P may receive the balanced signal from the high power amplifying unit 110, and the secondary winding S may convert the balanced signal into a single signal by electromagnetic coupling with the primary winding and output the converted signal. In addition, the secondary winding S may be connected to the switching part 122 to thereby output the signal amplified from the low power amplifying unit 120, as described above.

An impedance matching part 140 may match an impedance of a signal transfer path between the driving amplifying part 111 and the power amplifying part 112 of the high power amplifying unit 110.

Describing an operation of the power amplifier according to the embodiment of the present invention in detail, when the user selects the high power mode, the MOSFETs of the first to fourth cascode amplifiers 111a, 111b, 112a, and 112b are turned on by the gate signals Vg1 and Vg_PA, and the input signal is amplified through the driving amplifying part 111 and the power amplifying part 112 and is then output through the coupling unit 130. At this time, the MOSFET of the amplifying part 121 is turned off by the gate signal Vg2, such that an operation of the amplifying part 121 is stopped, and the first and second switches SW1 and SW2 are switched on to thereby allow one end of the second winding S to be connected to the ground and allow the capacitor C connected to the other end of the secondary winding S to be connected to the ground.

On the other hand, when the user selects the low power mode, the MOSFETs of the first to fourth cascode amplifiers 111a, 111b, 112a, and 112b are turned off by the gate signals Vg1 and Vg_PA, such that an operation of the high power amplifying unit 110 is stopped, the input signal is transferred to the amplifier Q of the amplifying part 121 connected to the common source node through the third MOSFET N3 of the second cascode amplifier 112, and the MOSFET of the amplifying part 121 is turned on by the gate signal Vg2, such that the amplifier Q amplifies the input signal. Here, even if the input signal is the balanced signal, only a single signal component transferred to the third MOSFET N3 of the second cascode amplifier 112 may be amplified. Meanwhile, the first and second switches SW1 and SW2 are switched on, such that the signal amplified by the amplifying part 121 is transferred to the secondary winding S and is output through the other end of the secondary winding S.

When the user selects the low power mode, the operation of the high power amplifying unit 110 is stopped and the first and second switches SW1 and SW2 are switched off, such that an impedance at a primary side viewed from the secondary winding S of the coupling unit 130 has a significantly large value. Therefore, an impedance viewed from the low power amplifying unit 120 may be almost the same as that of an output terminal.

Figure 2:
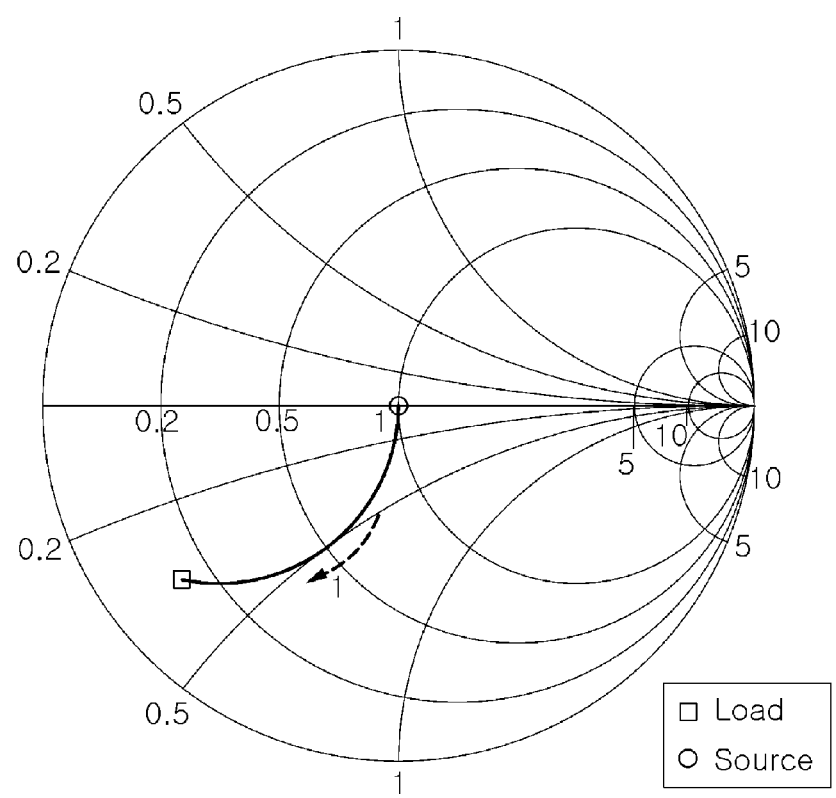
FIG. 2 is a simulation view of a resistance value viewed from a low power amplifying unit of a multi-mode power amplifier according to an embodiment of the present invention.

FIG. 2 is a simulation view of a resistance value viewed from a low power amplifying unit of a multi-mode power amplifier according to an embodiment of the present invention.

Referring to FIG. 2, a real-number part of an impedance Z_low viewed from the low power amplifying unit 120 becomes smaller as a capacitance of the capacitor COUT becomes larger, which is not a matching point for allowing an amplifier Q having a small magnitude for low power amplification to generate a large output. Therefore, it is difficult to implement output impedance matching. It may be appreciated that when a capacitor COUT having a capacitance of, for example, about 4 pF is used, a real-number value is reduced from 50 ohm to 6.5 ohm. Therefore, the second switch SW2 is used to connect or open between the capacitor COUT and the ground, whereby the impedance may be easily matched in the low power mode.

In addition, the first and second switches SW1 and SW2 are not connected in series with the signal transfer path but are connected to the ground, such that it may be less influenced by break-down generated in the switch formed in the signal transfer path, whereby a reduction in power efficiency and linearity may be minimized.

Figure 3:
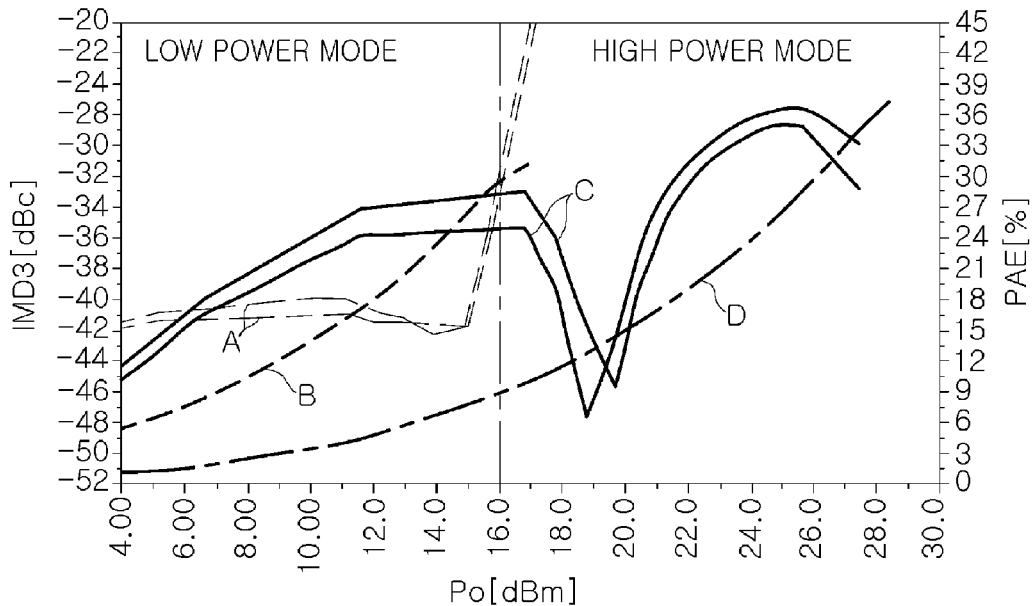
FIG. 3 is a graph showing linearity and efficiency of a multi-mode power amplifier according to an embodiment of the present invention.
Figure 4:
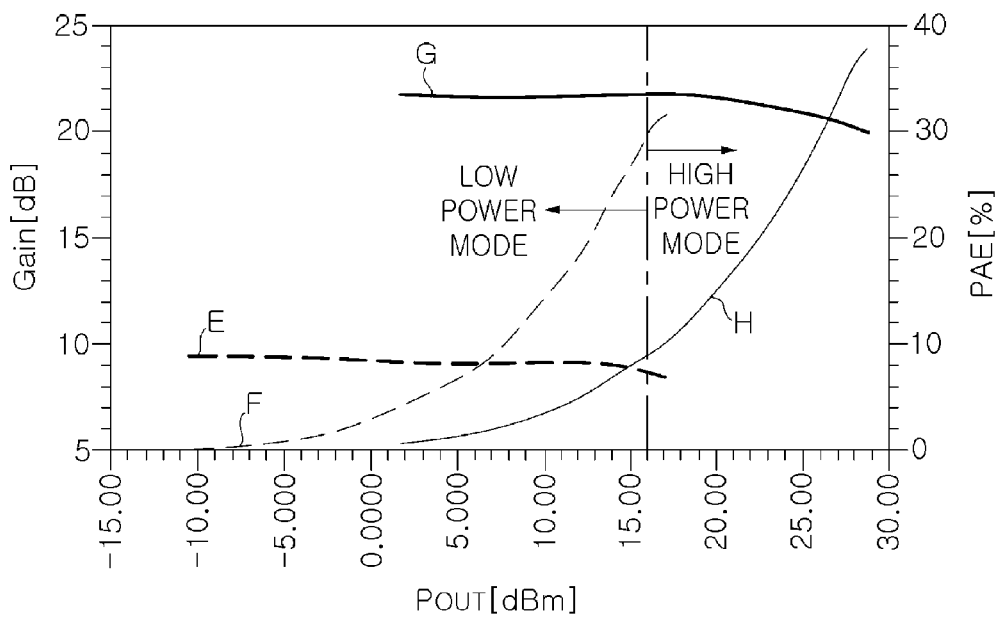
FIG. 4 is a graph showing a power gain and efficiency of a multi-mode power amplifier according to an embodiment of the present invention.

FIG. 3 is a graph showing linearity and efficiency of a multi-mode power amplifier according to an embodiment of the present invention; and FIG. 4 is a graph showing a power gain and efficiency of a multi-mode power amplifier according to an embodiment of the present invention.

Referring to FIG. 3, it may be appreciated that when IMD3 (A) in a low power mode is compared with IMD3 (C) in a high power mode, an efficiency peak is generated once more at a point at which an output is lower than 28 dBm, which is the maximum linear output, by 13 dBm. When a reference of the linearity is set to IMD3-25 dBc, linear power of 16 dBm or more and efficiency of 30% or more at this time may be obtained (See reference signs B and D). Therefore, the efficiency increases by approximately 20% or more as compared to the single mode power amplifier according to the related art, whereby a call time of a mobile communications terminal may be very effectively improved.

Referring to FIG. 4, power gains G and E and efficiencies H and F in the high power and low power modes of the power amplifier according to the embodiment of the present invention may be appreciated.

It may be appreciated that the power gain in the high power mode is higher than the power gain in the low power mode. On the other hand, it may be appreciated that the efficiency in the low power mode is higher than the efficiency in the high power mode in 16 dBm or less in the same output dBm.

As described above, according to the embodiment of the present invention, a two-stage amplifier is used at the time of the high power mode, a single amplifier in which the common source node of the amplifiers is shared is used at the time of the low power mode, and the secondary winding of the coupling transformer is connected to or opened from the ground at the time of selection of the high power and low power modes, such that an additional impedance matching circuit is not required, whereby power loss may be reduced while a circuit area and manufacturing costs are reduced. Therefore, a battery lifespan and a call time of the mobile communications terminal using the multi-mode power amplifier according to the embodiment of the present invention may be improved, and call quality may be improved. In addition, the multi-mode power amplifier according to the embodiment of the present invention may be configured as a single chip using the CMOS process, whereby the mobile communications terminal may be miniaturized.

As set forth above, according to the embodiment of the present invention, the common source node of the cascode amplifier is used in common and the output is selectively connected to the secondary winding of the coupling unit, such that a separate impedance circuit is not required at the time of operations in the low power mode and the high power mode, whereby manufacturing costs and a circuit area may be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A multi-mode power amplifier comprising:
   a high power amplifying unit including at least one cascode amplifier to amplify an input signal to a high power level having a preset power range;
   a low power amplifying unit sharing a common source node of the at least one cascode amplifier to amplify the input signal to a low power level having a power range lower than the high power level; and
   a coupling unit coupling a transfer path of a signal output from the high power amplifying unit and a transfer path of a signal output from the low power amplifying unit to each other.

2. The multi-mode power amplifier of claim 1, wherein the low power amplifying unit includes:
   an amplifying part including an amplifier amplifying the input signal from the shared common source node to the low power level; and
   a switching part including at least one switch opening or closing the transfer path of the signal through which the signal amplified from the amplifying part is transferred to the coupling unit according to a selection of power modes.

3. The multi-mode power amplifier of claim 2, wherein the coupling unit includes a primary winding receiving the signal amplified from the high power amplifying unit and a secondary winding receiving the signal amplified from the low power amplifying unit and electromagnetically coupled to the primary winding to thereby couple the transfer paths of the signals to each other.

4. The multi-mode power amplifier of claim 3, wherein the switching part includes a first switch connected between one end of the secondary winding and a ground to thereby transfer the signal amplified from the amplifying part to the secondary winding or connect one end of the secondary winding and the ground to each other.

5. The multi-mode power amplifier of claim 4, wherein the switching part further includes:
   a capacitor connected to the other end of the secondary winding from which the signal is output; and
   a second switch connected between the capacitor and the ground and being switched on or off together with the first switch, thereby connecting or opening between the capacitor and the ground.

6. The multi-mode power amplifier of claim 2, wherein the amplifying part is an N type metal oxide semiconductor field effect transistor (MOSFET) having a drain outputting the amplified signal, a source connected to the common source node, and a gate receiving a gate signal.

7. The multi-mode power amplifier of claim 1, wherein the high power amplifying unit includes:
   a driving amplifying part including first and second cascode amplifiers connected with each other in parallel to thereby amplify the input signal according to a set gain; and
   a power amplifying part including third and fourth cascode amplifiers connected with each other in parallel to thereby amplify the signal amplified from the driving amplifying part according to a set gain.

8. The multi-mode power amplifier of claim 7, wherein the low power amplifying unit shares a common source node of the first or second cascode amplifier of the driving amplifying part.

9. The multi-mode power amplifier of claim 1, wherein the input signal is a single signal or a balanced signal.

10. The multi-mode power amplifier of claim 7, wherein the high power amplifying unit further includes an impedance matching part matching an impedance of a transfer path of the signal between driving amplifying part and the power amplifying part.

* * * * *

UNITED STATES PATENT AND TRADEMARK OFFICE
CERTIFICATE OF CORRECTION

PATENT NO. : 8,378,744 B2
APPLICATION NO. : 13/279953
DATED : February 19, 2013
INVENTOR(S) : Bon Hoon Koo It is certified that error appears in the above-identified patent and that said Letters Patent is hereby corrected as shown below:

Specifically, on the title page of the patent, in Item "(73) Assignee name should read -Samsung Electro-Mechanics Co., Ltd. And Korea Advanced Institute of Science and Technology- rather than Samsung Electronics Co., Ltd. And Korea Advanced Institute of Science and Technology.

Signed and Sealed this
Twenty-ninth Day of October, 2013

Teresa Stanek Rea
*Deputy Director of the United States Patent and Trademark Office*